United States Patent
Wong

[11] Patent Number: 5,844,443
[45] Date of Patent: Dec. 1, 1998

[54] LINEAR HIGH-FREQUENCY AMPLIFIER WITH HIGH INPUT IMPEDANCE AND HIGH POWER EFFICIENCY

[75] Inventor: Stephen L. Wong, Scarsdale, N.Y.

[73] Assignee: Philips Electronics North America Corporation, New York, N.Y.

[21] Appl. No.: 762,876

[22] Filed: Dec. 12, 1996

[51] Int. Cl.⁶ .................................................. H03F 3/26
[52] U.S. Cl. ........................................ 330/275; 330/301
[58] Field of Search ................................ 330/255, 262, 330/273, 274, 275, 301

[56] References Cited

U.S. PATENT DOCUMENTS

| | | | |
|---|---|---|---|
| 3,883,813 | 5/1975 | Sekiya | 330/13 |
| 4,431,972 | 2/1984 | Ishii et al. | 330/267 |
| 4,442,409 | 4/1984 | Preslar | 330/255 X |
| 4,502,020 | 2/1985 | Nelson et al. | 330/265 |
| 4,893,091 | 1/1990 | Lillis et al. | 330/253 |
| 5,049,834 | 9/1991 | Kasai | 330/255 |
| 5,365,198 | 11/1994 | Wong | 330/288 |
| 5,424,686 | 6/1995 | Wong et al. | 330/302 |

FOREIGN PATENT DOCUMENTS

0293486A1   12/1988   European Pat. Off. .

*Primary Examiner*—James B. Mullins
*Attorney, Agent, or Firm*—Steven R. Biren

[57] ABSTRACT

A high-frequency power amplifier circuit offers the advantages of high input impedance, good linearity, high power efficiency and accurate bias current control in a compact and economical circuit configuration. The amplifier includes a single-ended output stage driven by a symmetrical push-pull emitter follower stage with both active pull-down and active pull-up capability. The emitter follower stage is driven by an active phase-splitter stage, with bias current for the phase-splitter stage and subsequent stages being provided by a bias-current control stage which is directly connected to the phase splitter stage. A linear voltage-to-current converter stage receives a high-frequency input voltage and provides a high-frequency current signal to the input terminal of the bias-current control stage that controls the current in the output stage.

6 Claims, 2 Drawing Sheets

LINEAR HIGH-FREQUENCY AMPLIFIER WITH HIGH INPUT IMPEDANCE AND HIGH POWER EFFICIENCY

BACKGROUND OF THE INVENTION

This invention is in the field of transistor amplifier circuits, and relates more particularly to high-efficiency, high-frequency linear power amplifiers.

High-frequency power amplifiers typically use a common-emitter (or common-source in the case of a FET) circuit configuration as the output power stage to achieve optimum collector efficiency. The input impedance of such a stage is typically low (typically a few ohms or less), requiring that it be driven either by another driver stage or an impedance transforming stage. To ensure that the overall efficiency of the amplifier is high, the power consumed by the previous stage must be minimized.

When an L-C impedance transforming stage is used, power is generally lost to the parasitic components in the circuit. In the case of a monolithic silicon solution, the loss can be substantial due to the inherently low Quality Factor (Q) available when using integrated inductors (in the typical case Q will be less than 5). For a 1 W power amplifier operating at 830 MHz, for example, the loss in the impedance transforming stage is primarily responsible for limiting the efficiency of the amplifier to about 30%.

An alternative to using an impedance transforming network is to use an active impedance buffer, such as an emitter (or source) follower stage. This stage can provide some current gain and can achieve high levels of input impedance. However, there is an inherent negative resistance effect present with this approach which must be adequately compensated for before stable operation of the amplifier is possible. Nevertheless, the emitter follower technique has been used successfully to boost the impedance levels of both the input stage and the intermediate stage of an 830 MHz amplifier. Extending the application of this technique to the output stage has heretofore not been a viable solution because of efficiency considerations since the emitter follower itself tends to dissipate a significant amount of power.

In the conventional emitter follower design, the quiescent current must be biased at a relatively high level to ensure that the output has symmetrical charge and discharge capability. However, this high current level results in an undesirable power loss. In the prior art, the output discharge path is provided either by a resistor, or by a constant current source. The value of the resistor or current source must be chosen such that the quiescent current is as great or greater than the peak drive current being provided by the pull-up transistor. Since this drive current typically needs to be about 10% of the peak collector current of the output transistor (determined by f/fT where f is the operating frequency and fT is the unity gain bandwidth of the transistor), this is equivalent to about 31% (for class B biasing) of the average value of the output collector current. However, if the quiescent current in the emitter follower must be at least 31% of the output transistor's average collector current, this represents an unacceptable loss in a high-efficiency amplifier design.

One solution to help reduce the loss in the emitter follower stage is to introduce push-pull capability to that stage. The charge and discharge currents can then be made independent of the value of the quiescent current, allowing the value of the bias current to be reduced significantly. However, effective implementation of such a scheme is not apparent in monolithic form, especially if it is desired to maintain accurate control of the quiescent currents in both the emitter follower stage and the output stage. This last requirement is important to ensure that the performance of the amplifier will not change with process, supply voltage and temperature variations.

In many of today's portable communication devices, such as cellular phones and Personal Communication Systems (PCS), power amplifiers are needed in the transmitter to drive the antenna at high frequencies (800 Mhz to 2 Ghz). These amplifiers must operate at high levels of efficiency (typically greater than 40%) in order not to drain the battery supply prematurely. A common approach to achieving high efficiency is to bias the amplifier in a nonlinear mode of operation, such as in class B or higher. However, in a recently popularized communication standard developed by Qualcomm Inc. and known as Code-Division-Multiple-Access (CDMA), the transmitter amplifier must be capable of maintaining constant gain and phase characteristics over a wide range of output power levels. This requirement restricts the use of nonlinear biasing schemes such as class B biasing, creating a need for amplifiers that are both linear and power efficient, while capable of operating at high frequencies. Such amplifiers should also be capable of being easily miniaturized and economically manufactured.

It is generally difficult to achieve constant gain and phase amplification with high efficiency, especially at high frequencies. The conventional approach is to operate the amplifier in the linear or Class A mode. In this mode the output parameter varies linearly with the input parameter so that its slope, or gain, remains constant independent of the value of the output. Because of the inherent nonlinear behavior of most amplifier devices (e.g. a bipolar transistor has an exponential voltage-current characteristic), the amplifier must be biased at a fairly high value of dc current and with a fairly restricted output swing in order to preserve its linearity. This combination of small ac swing and large dc bias is the direct cause of the low efficiency (typically <25%) attainable in the linear mode.

As already mentioned, to bias an amplifier to achieve higher efficiency, the conventional approach of class B biasing is generally preferred. With this scheme, the amplifier is biased at a very low quiescent current, while a large ac signal is used to force the output to a high current state. To achieve this, significantly larger input swings are applied about the bias point. However, because the output must follow the nonlinear characteristics of the amplifier device, the gain of the amplifier will change as a function of the signal level. Hence the gain of a class B amplifier is typically nonlinear and will change as a function of the output power level.

While circuit techniques are available to linearize the input-output characteristic of an amplifier, they generally require the use of negative feedback and/or the use of a resistor as the linearizing element. The use of negative feedback is typically more difficult at high frequencies because the presence of parasitic poles at high frequencies can turn the negative feedback into positive feedback, resulting in either instability or distortion, whereas the use of a resistor in the power stage generally means high resistive losses that will contribute significantly to lower amplifier power efficiency.

Accordingly, it would be desirable to have a high-frequency amplifier which offers the advantages of linear operation, a high input impedance, a low-power-consumption driver stage and independently-controlled bias currents to ensure that performance of the amplifier will not change with process, supply voltage or temperature variations. Additionally, it would be desirable for such a circuit to be simple and compact in design, and economical to manufacture.

SUMMARY OF THE INVENTION

It is therefore an object of the invention to provide a high-frequency amplifier which offers a combination of features, including linear operation, a high input impedance, low power consumption in the driver stage and independently-controlled bias currents in order to optimize the power efficiency of the amplifier and insure that variations in performance due to changes in process, supply voltage and temperature will be minimized. It is a further object of the invention to provide a linear high-frequency amplifier which is both simple and compact in design and which is economical to manufacture.

In accordance with the invention, these objects are achieved by a new linear high-frequency amplifier circuit in which a single-ended output stage is driven by a symmetrical push-pull emitter follower stage which has both active pull-down and active pull-up capability. The push-pull emitter follower stage is in turn driven by a phase-splitter stage which uses at least two transistors to provide two low-impedance split-phase outputs to the emitter follower stage. A bias-current control stage (bias stage) which is directly connected to the phase-splitter stage is employed to provide bias currents to the phase-splitter stage in such a manner that the bias currents for the phase-splitter stage as well as the emitter follower and output stages can be accurately controlled. The high-frequency input voltage to be amplified is provided to a linear voltage-to-current converter stage, the output of which is connected to the input of the phase-splitter stage to provide a high-frequency current signal proportion to the input voltage thereto.

This ability to accurately control bias currents permits the performance of the amplifier to be stabilized over voltage, process and temperature variations. It also permits the gain of the amplifier to be controlled, such as by an automatic gain control (AGC) feature, and even permits control of the operating class of the amplifier in order to optimally satisfy a desired combination of efficiency, gain and linearity requirements in a particular amplifier application.

The present invention provides an amplifier with a linear gain, constant-slope input-output characteristic that is applicable even at high (over 600 Mhz) frequencies, yet does not make use of any lossy resistive elements in the output stage. The circuit is thereby low loss and can be biased at low or even zero bias current to achieve a relatively high efficiency while satisfying the constant gain and phase requirements that are dictated by some applications (such as CDMA). The topology is also quite flexible in that important characteristics of the amplifier (gain, input offset, current bias levels) can be accurately and electrically adjusted by appropriately selecting dc inputs or component values. In addition, the topology is highly integrable in conventional silicon bipolar processes and allows the high-frequency signal to be amplified by npn components, thus eliminating the need for expensive processes with high performance complementary components.

In a preferred embodiment of the invention, the phase-splitter stage is composed of three transistors having their main current paths coupled in series between a power supply terminal and a ground terminal, with two split-phase output signals being taken from the junctions between the main current paths of the first and second transistors, and between the main current paths of the second and third transistors.

In a further preferred embodiment of the invention, the push-pull emitter follower stage is composed of two transistors having their main current paths coupled in series between the power supply terminal and the ground terminal, with the two split-phase outputs from the phase-splitter stage being provided to control terminals of the two transistors, and the emitter follower output being taken from a point between the main current paths of the two transistors.

In yet a further preferred embodiment of the invention, the bias-current control stage (bias stage) provides bias currents directly to control terminals of the first and second transistors of the phase-splitter stage, and the input terminal of the phase-splitter stage is the control terminal of the second transistor.

High-frequency amplifiers in accordance with the present invention offer a significant improvement in that a particularly advantageous combination of features, including good linearity, a high input impedance, high efficiency and accurate bias current control can be obtained in a simple and economical configuration.

These and other aspects of the invention will be apparent from and elucidated with reference to the embodiments described hereinafter.

BRIEF DESCRIPTION OF THE DRAWING

The invention may be more completely understood with reference to the following description, to be read in conjunction with the accompanying drawing, in which.

In the drawing, like reference numerals are generally used to designate like components.

DESCRIPTION OF THE PREFERRED EMBODIMENTS

Figure 1:
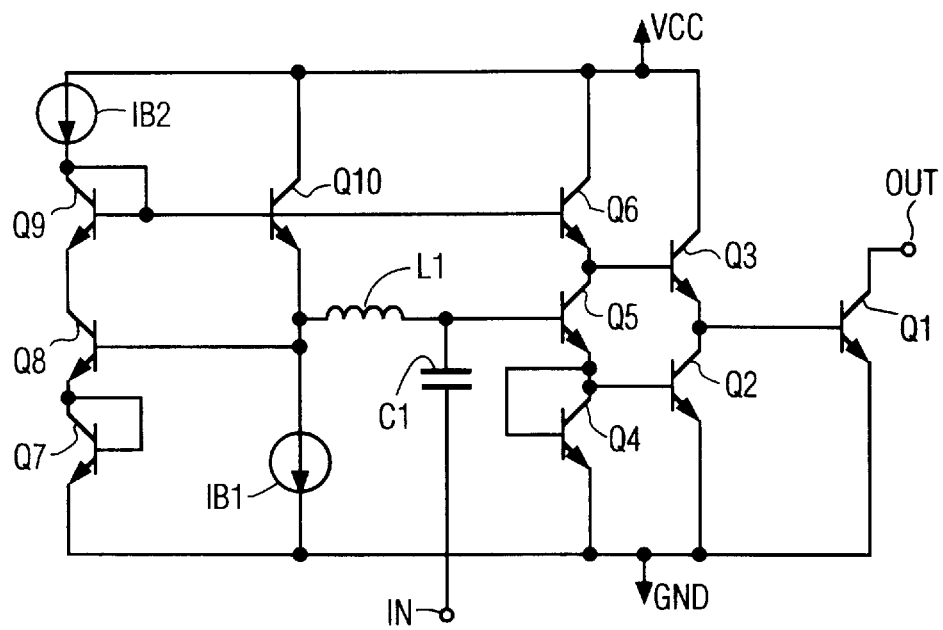
FIG. 1 shows a schematic diagram of first embodiment of a prior-art high-frequency amplifier.

A prior-art high-frequency amplifier circuit of the type disclosed in copending parent U.S. patent application Ser. No. 08/798,195, filed on Dec. 5, 1996, and entitled HIGH-FREQUENCY AMPLIFIER WITH HIGH INPUT IMPEDANCE AND HIGH POWER EFFICIENCY, is shown in schematic form in FIG. 1. The amplifier circuit includes a single-ended output stage having a transistor Q1 in a common emitter configuration and having its collector terminal connected to an output terminal OUT, which will be coupled to appropriate power supply and load components in operation. It should be noted that although of the transistors shown in the drawing are npn bipolar transistors, it should be understood that other types of transistors may alternatively be employed. It should also be understood that, in operation, the circuits shown in the drawing will be connected during operation between upper and lower power supply terminals, designated in the figures by upward-facing and downward-facing arrows, VCC and GND respectively.

Output transistor Q1 is driven by a push-pull emitter follower stage composed of transistors Q2 and Q3, having their main current paths connected in series, with the base of transistor Q1 being connected to the common connection between the collector of transistor Q2 and the emitter of transistor Q3. The output at the collector of transistor Q1 can be taken as a current, or else converted to a voltage or power level by an impedance such as an inductor, resistor or current source.

In order to provide the emitter follower stage with push-pull capability, complementary signals must be provided to the bases of transistors Q2 and Q3. These signals are generated by an active phase-splitter stage comprising transistors Q4, Q5 and Q6, having their main current paths connected in series between the power supply terminals. The split-phase outputs from the phase-splitter stage are taken from the junctions between transistors Q4 and Q5, and between transistors Q5 and Q6, respectively, as shown in FIG. 1.

The high-frequency input to the amplifier is provided at terminal IN and coupled to the base of transistor Q5 of the phase-splitter by capacitor C1. In operation, the phase splitter will generate an in-phase signal at the emitter of Q5 and a 180° out-of-phase signal at the collector of transistor Q5, to generate the split-phase signals applied to the bases of transistors Q2 and Q3, respectively. Additionally, transistor Q6 acts as a low-impedance load for transistor Q5, which helps to cancel any negative resistance occurring at the base of transistor Q3, and diode-connected transistor Q4 acts as an emitter degeneration transistor for transistor Q5 while also providing the current to discharge output transistor Q1 via a current mirror composed of transistors Q2 and Q4.

Bias-current control in the output and emitter-follower stages is achieved using a DC bias stage comprising transistors Q7 to Q10, connected as shown in FIG. 1, and two current sources IB1 and IB2. In this circuit, the base of transistor Q6 is coupled directly to the base and collector of transistor Q9 and the base of transistor Q10, while the base of transistor Q5 is coupled to the base of transistor Q8 by an off-chip inductor L1 in order to isolate the bias-current control circuitry from the high-frequency input signal.

In the circuit shown in FIG. 1, the quiescent current in the output stage can be made proportional to current source IB1, while the current in the emitter follower stage can be made proportional to current source IB2. By externally controlling IB1 and IB2, total control over the bias conditions of the output stage can be obtained.

To understand how the bias stage influences the current in the amplifier, assume that all transistors in the circuit are identical and perfectly matched. Kirchoff's Law dictates that the DC voltage VBE4+VBE5 must equal VBE7+VBE8. Since IB2 flows in transistors Q7 and Q8, IB2 must also flow in transistors Q4 and Q5. Since transistors Q2 and Q4 comprise a current mirror, IB2 must also flow in the emitter-follower transistors Q2 and Q3. In a similar fashion, since VBE1+VBE3+VBE6=VBE4+VBE5+VBE10 (assuming a negligible DC voltage drop across inductor L1), and transistors Q2, Q3, Q4, Q5 and Q6 all have identical values of VBE and bias current, VBE1 must equal VBE10. Since the quiescent current in transistor Q10 is dictated by current source IB1, IB1 thus dictates the quiescent current in the output transistor Q1.

By properly scaling the emitter area ratios between transistor pairs, the current in transistor Q1 can be made directly proportional to (rather than equal to) the value of IB1, and the current in transistors Q3 and Q2 can be made proportional to the value of IB2. For example, the ratios can be 32 to 1 and 4 to 1, respectively. By using this circuit configuration, the quiescent current of the emitter follower can be accurately biased to a relatively low value for the purpose of saving power and increasing efficiency, while the base of the output transistor Q1 can be charged and discharged in a complementary yet efficient manner by transistors Q3 and Q2, at a frequency equal to that of the RF input.

Figure 2:
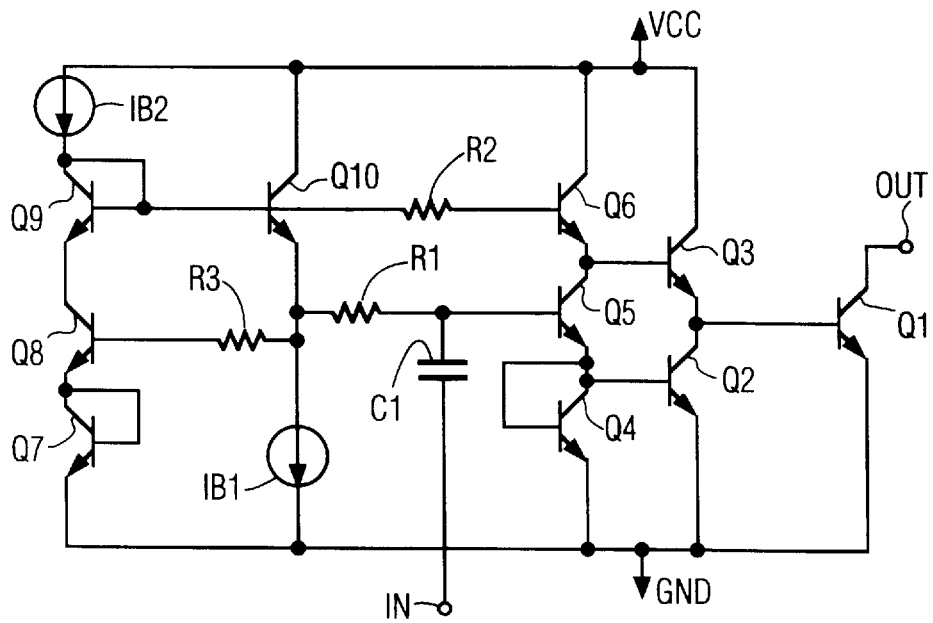
FIG. 2 shows a schematic diagram of a second embodiment of a prior-art high-frequency amplifier.

As an alternative to the circuit of FIG. 1, in which RF decoupling is achieved by an external inductor, a fully monolithic circuit implementation can be achieved by replacing the inductor with a monolithic resistor whose value is high enough such that it effectively acts as an open circuit to the RF input, as shown by resistor R1 in prior-art FIG. 2, which circuit is also disclosed in the aforementioned copending parent U.S. patent application. A typical value for resistor R1 is in the range of 200–1000 ohms. However, in order to accommodate the DC voltage drop across this resistor (typically small, about 0.2V or less), an equivalent amount of voltage drop must be added to the bases of transistors Q6 and Q8 in order to achieve the desirable VBE cancellation as discussed above. This means that an equivalent amount of resistance must be added to the bases of transistor Q6 and Q8, as shown by resistors R2 and R3, respectively. This resistance can typically be added without significantly altering the AC behavior of the RF amplifier.

The key to obtain both high frequency and good linearity is to provide a circuit that displays linear voltage and current characteristics and will remain linear even at high frequencies. The amplifier then be biased at very low quiescent current as in the case of a class B amplifier, but because of the linear characteristic, both gain and phase will not change as it is driven into higher power levels.

Figure 3:
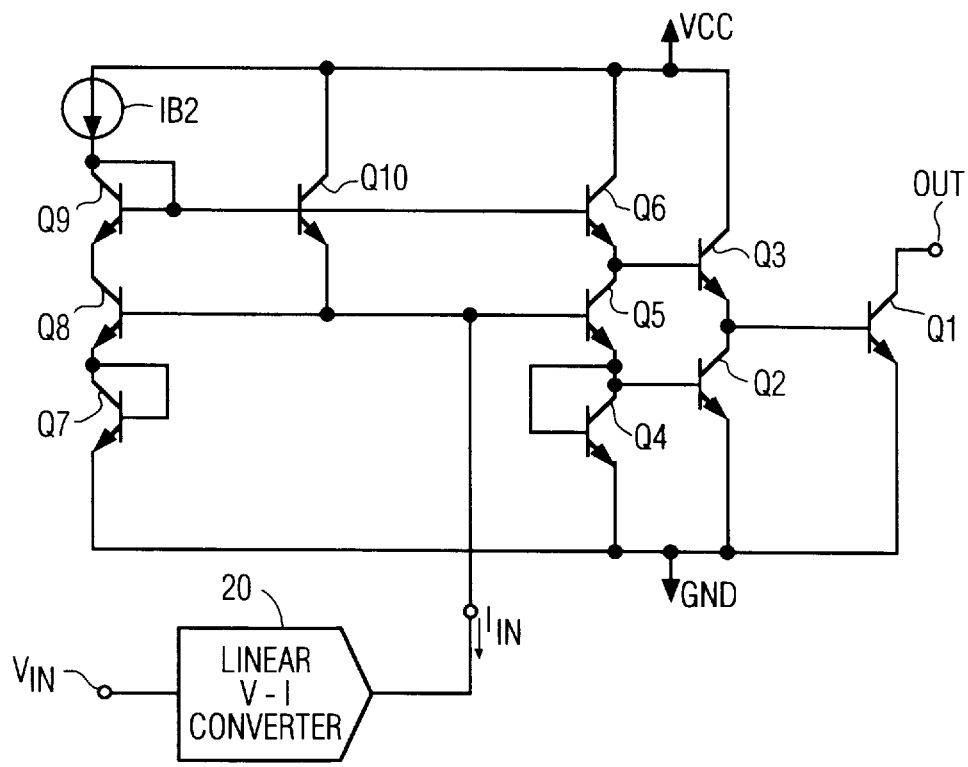
FIG. 3 shows a schematic diagram of a linear high-frequency amplifier in accordance with the invention.

The linear amplifier of the invention is composed of a linear current gain power stage, preceded by a linear voltage-to-current converter (transconductance) stage 20 as shown in FIG. 3. The linear current gain stage is derived from the nonlinear high-efficiency transconductance gain amplifiers of FIGS. 1 and 2. In FIGS. 1 and 2, RF input is applied to the input node at the base of transistor Q5 by an AC coupling capacitor C1. DC bias to the input node is provided from the bias stage by an inductor (FIG. 1) or a resistor (FIG. 2). These elements are required to isolate the bias stage from the RF input signal. The bias stage has the desirable property that the DC bias currents in all three stages can be controlled by the DC bias currents IB1 and IB2. In FIGS. 1 and 2, the use of an isolating element is necessary because the emitter of Q10 is a low impedance node that would severely attenuate the input RF voltage if directly connected to the base of Q5.

In FIG. 3, however, the emitter of Q10 and the base of Q5 are deliberately connected together. Input $I_{IN}$ is now supplied from an AC current signal source generated from the preceding transconductance stage 20. Because the input is now current instead of voltage, the low impedance at the emitter of Q10 will not act to attenuate the signal. Because VBE of Q10 tracks VBE of the output transistor Q1, both AC and DC current from the previous stage that flows into Q10 will be linearly amplified by the output transistor Q1, with the current gain given by the ratio of emitter areas between Q1 and Q10. In this arrangement, the transconductance stage 20 provides a high-frequency current signal to the input terminal of the bias-current control stage that controls the current in the output stage. By ensuring that the signal flows only through npn transistors, high frequency operation can be obtained.

Figure 4:
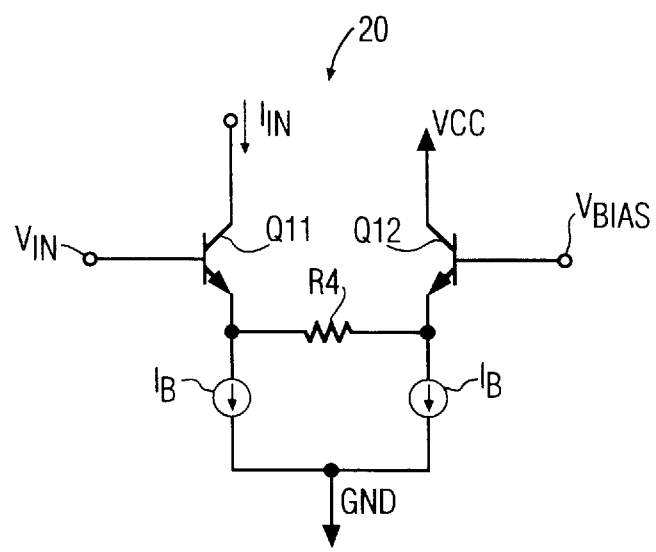
FIG. 4 shows a schematic diagram of a linear voltage-to-current converter suitable for use in the circuit of FIG. 3.

The implementation of the voltage-to-current linear (transconductance) stage 20 can be accomplished in various ways. A preferred embodiment is shown in FIG. 4, which shows a differential stage composed of npn bipolar transistors Q11 and Q12 with two tail-current sources $I_B$ separated by a linear resistor R4. Because this stage operates at a substantially lower current than that of the output stage, losses incurred by resistor R4 can be considered negligible. Increasing the voltage $V_{IN}$ with respect to $V_{BIAS}$ increases the output current $I_{IN}$ linearly from near zero to $2I_B$ as a function of $(V_{IN}-V_{BIAS})/R4$. By controlling the value of R4, $I_B$ and $V_{BIAS}$, flexible control of the bias point and transconductance gain is possible.

When a transconductance stage such as the voltage-to-current converter 20 of FIG. 4 is used in conjunction with the amplifier circuit of FIG. 3, the efficiency advantage of low quiescent current can be combined with the operational advantage of linear amplification in a single circuit.

In this manner, the present invention provides a high-frequency amplifier circuit which offers good linearity, high input impedance, low power consumption in the driver stage and independently-controlled bias currents in order to optimize both the linearity and the power efficiency of the amplifier and ensure that variations in performance due to changes in process, supply voltage and temperature will be minimized. Additionally, the present invention provides a high-frequency amplifier which is both simple and compact in design and which is economical to manufacture.

While the invention has been particularly shown and described with reference to several preferred embodiments thereof, it will be understood by those skilled in the art that various changes in form and detail may be made without departing from the spirit and scope of the invention. Thus, for example, different types of transistors may be employed as appropriate, and minor alterations to the circuit configuration may be made to suit particular design requirements.

What I claim is:

1. A linear high-frequency amplifier, which comprises:
    a single-ended output stage having a control terminal and an output terminal;
    a push-pull emitter follower stage having first and second input terminals, and an output terminal coupled to the control terminal of said output stage;
    a phase-splitter stage having an input terminal, first, second and third transistors having their main current paths coupled in series between a power supply terminal and a ground terminal, and first and second low-impedance split-phase output terminals coupled to the first and second input terminals of said emitter follower stage, said first split-phase output terminal being coupled to a point between said first and second transistors and said second split-phase output terminals being coupled to a point between said second and third transistors;
    a bias-current control stage directly connected to said phase-splitter stage for providing bias currents to said at least two transistors of said phase-splitter stage; and
    a linear voltage-to-current converter stage having an input terminal for receiving a high-frequency input voltage and an output terminal connected to the input terminal of said phase-splitter stage for providing a high-frequency current signal proportional to said input voltage thereto.

2. A linear high-frequency amplifier as in claim 1, wherein said push-pull emitter follows stage comprises fourth and fifth transistors having their main current paths coupled in series between said power supply terminal and said ground terminal, said first and second input terminals of said emitter follower stage comprise control terminals of said fourth and fifth transistors, respectively, and said emitter follower output terminal is coupled to a point between said fourth and fifth transistors.

3. A linear high-frequency amplifier as in claim 2, wherein said bias stage provides bias currents directly to control terminals of said first and second transistors of said phase-splitter stage and said input terminal of said phase-splitter stage comprises said control terminal of said second transistor.

4. A linear high-frequency amplifier as in claim 3, wherein all of said transistors are of the same type.

5. A linear high-frequency amplifier as in claim 4, wherein all of said transistors are npn bipolar transistors.

6. A linear high-frequency amplifier as in claim 1, wherein said linear voltage-to-current converter stage comprises a differential stage.

\* \* \* \* \*